US012796184B2

(12) United States Patent
Yun et al.

(10) Patent No.: US 12,796,184 B2
(45) Date of Patent: Nov. 10, 2026

(54) NEAR INFRARED PHOSPHOR AND LIGHT EMITTING DEVICE

(71) Applicant: SAMSUNG ELECTRONICS CO., LTD., Suwon-si (KR)

(72) Inventors: Jeongeun Yun, Suwon-si (KR); Seongmin Kim, Suwon-si (KR); Sungwoo Choi, Suwon-si (KR); Kyounghoon Kim, Siheung-si (KR); Minhee Noh, Siheung-si (KR); Jeongrok Oh, Suwon-si (KR)

(73) Assignees: SAMSUNG ELECTRONICS CO., LTD., Suwon-si (KR); DAEJOO ELECTRONIC MATERIALS CO., LTD., Siheung-si (KR)

( * ) Notice: Subject to any disclaimer, the term of this patent is extended or adjusted under 35 U.S.C. 154(b) by 353 days.

(21) Appl. No.: 18/662,576

(22) Filed: May 13, 2024

(65) Prior Publication Data

US 2024/0405165 A1 Dec. 5, 2024

(30) Foreign Application Priority Data

May 31, 2023 (KR) ........................ 10-2023-0070352

(51) Int. Cl.
*H10H 20/851* (2025.01)
*H10W 90/00* (2026.01)

(52) U.S. Cl.
CPC ........ *H10H 20/8513* (2025.01); *H10W 90/00* (2026.01)

(58) Field of Classification Search
CPC .......... H10H 20/8513; H10H 20/8512; H10W 90/00; A61N 5/0616; A61N 2005/0636;
(Continued)

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |

(Continued)

FOREIGN PATENT DOCUMENTS

| | | | | |
|---|---|---|---|---|
| CN | 112824480 A | | 5/2021 | |
| CN | 111423881 B | * | 6/2021 | ......... C09K 11/7756 |

(Continued)

OTHER PUBLICATIONS

Communication dated Sep. 6, 2024, issued by European Patent Office in European Patent Application No. 24178816.5.

(Continued)

*Primary Examiner* — Herve-Louis Y Assouman

(74) *Attorney, Agent, or Firm* — Sughrue Mion, PLLC

(57) ABSTRACT

A light emitting device includes a light emitting diode chip configured to emit first light having a peak wavelength of 400 nm to 470 nm; a wavelength conversion material converting a portion of the first light into second light having a peak wavelength of 620 nm to 670 nm; and a near-infrared phosphor configured to convert a portion of the first light into third light having a peak wavelength of 740 nm to 820 nm, wherein the near-infrared phosphor includes a phosphor represented by composition formula $CaAl_{(12-x-y)}Ga_yO_{19}$: $xCr^{3+}$, where x satisfies 0.1≤x≤0.3 and y satisfies 1 or more, and an emission spectrum of the third light alone has a ratio of an intensity of 690 nm relative to an intensity of 780 nm of 0.3 or less.

20 Claims, 11 Drawing Sheets

(58) Field of Classification Search
CPC .... A61N 2005/0659; A61N 2005/0665; F21K 9/23; F21Y 2113/30; C09K 11/685; C09K 11/617; C09K 11/64; C09K 11/7734
See application file for complete search history.

(56) References Cited

U.S. PATENT DOCUMENTS

| | | | |
|---|---|---|---|
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |
| 7,319,044 | B2 | 1/2008 | Han et al. |
| 7,501,656 | B2 | 3/2009 | Han et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,324,646 | B2 | 12/2012 | Lee et al. |
| 8,399,944 | B2 | 3/2013 | Kwak et al. |
| 8,432,511 | B2 | 4/2013 | Jeong |
| 8,459,832 | B2 | 6/2013 | Kim |
| 8,502,242 | B2 | 8/2013 | Kim |
| 8,536,604 | B2 | 9/2013 | Kwak et al. |
| 8,735,931 | B2 | 5/2014 | Han et al. |
| 8,766,295 | B2 | 7/2014 | Kim |
| 2020/0048549 | A1 | 2/2020 | Hong et al. |
| 2021/0381954 | A1* | 12/2021 | Kawamura .......... G01N 21/255 |

FOREIGN PATENT DOCUMENTS

| | | | |
|---|---|---|---|
| CN | 113308242 | A | 8/2021 |
| CN | 113845911 | A | 12/2021 |
| CN | 114717001 | A | 7/2022 |
| CN | 115109582 | A | 9/2022 |
| JP | 2022-71389 | A | 5/2022 |
| WO | 2018/207703 | A1 | 11/2018 |

OTHER PUBLICATIONS

L. Eric Cross, et. al. “Low Loss Substrates for Microwave Applications and Sol-Gel Processing of Superconductors”, Final Technical Report, Advanced Research Projects Agency and the Office of Naval Research, The Materials Research Laboratory, Sep. 1, 1990 to Mar. 31, 1994, 165 pages.

Balaji Venkateshwaran, et. al. “Low temperature dielectric properties of magnetoplumbite family of materials”, International Journal of Inorganic Materials, vol. 1, 1999, pp. 213-217, https://doi.org/10.1016/S1466-6049(99)00033-1.

* cited by examiner

IL-6 TEST RESULT

IL-8 TEST RESULT

NEAR INFRARED PHOSPHOR AND LIGHT EMITTING DEVICE

CROSS-REFERENCE TO RELATED APPLICATION(S)

This application claims benefit of priority to Korean Patent Application No. 10-2023-0070352 filed on May 31, 2023 in the Korean Intellectual Property Office, the disclosure of which is incorporated herein by reference in its entirety.

BACKGROUND

The present disclosure relates to a near-infrared phosphor and a light emitting device using the same.

In general, an LED light emitting device may include a light emitting device including at least one LED chip emitting light of a specific wavelength.

Recently, life (or human)-friendly lighting in consideration of biological effects on humans and living organisms, as well as conventional lighting functions, has been researched and developed. Specifically, by irradiating light of a specific wavelength band, a biologically beneficial effect improving the health of the human body or providing energy may be expected.

SUMMARY

An aspect of the present disclosure is to provide a high-efficiency near-infrared phosphor having a light biomodulation function.

An aspect of the present disclosure is to provide a light emitting device having a light biomodulation function.

According to an aspect of the present disclosure, a light emitting device includes a light emitting diode chip configured to emit first light having a peak wavelength of 400 nm to 470 nm; a wavelength conversion material converting a portion of the first light into second light having a peak wavelength of 620 nm to 670 nm; and a near-infrared phosphor configured to convert a portion of the first light into third light having a peak wavelength of 740 nm to 820 nm, wherein the near-infrared phosphor includes a phosphor represented by composition formula $CaAl_{(12-x-y)}Ga_yO_{19}:xCr^{3+}$, where x satisfies $0.1 \leq x \leq 0.3$ and y satisfies 1 or more, and an emission spectrum of the third light alone has a ratio of an intensity of 690 nm relative to an intensity of 780 nm of 0.3 or less.

According to an aspect of the present disclosure, a light emitting device includes a light emitting diode chip configured to emit light having a peak wavelength of 400 nm to 470 nm; a red wavelength conversion material converting a portion of the light into red light having a peak wavelength of 620 nm to 670 nm; and a near-infrared phosphor configured to convert a portion of the light into near-infrared light having a peak wavelength of 740 nm to 820 nm, wherein the near-infrared phosphor includes a phosphor represented by composition formula $CaAl_{(12-x-y)}Ga_yO_{19}:xCr^{3+}$, where x satisfies $0.1 \leq x \leq 0.3$ and y satisfies 1 or more, and an emission spectrum of the near-infrared light has a ratio of an intensity of 690 nm relative to an intensity of 780 nm of 0.3 or less, and has a full-width-half-maximum (FWHM) of 90 nm to 110 nm, wherein an emission spectrum of final light of the light emitting device covers 60% or more of an ATP action spectrum.

According to an aspect of the present disclosure, a near-infrared phosphor represented by composition formula $CaAl_{(12-x-y)}Ga_yO_{19}:xCr^{3+}$, where x satisfies $0.1 \leq x \leq 0.3$ and y satisfies 1 or more, wherein an emission spectrum by excitation light of the near-infrared phosphor has a ratio of an intensity of 690 nm relative to an intensity of 780 nm of 0.3 or less, and has a full-width-half-maximum (FWHM) of 90 nm to 110 nm, is provided.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, various embodiments of the present disclosure will be described in more detail with reference to the accompanying drawings.

Figure 1:
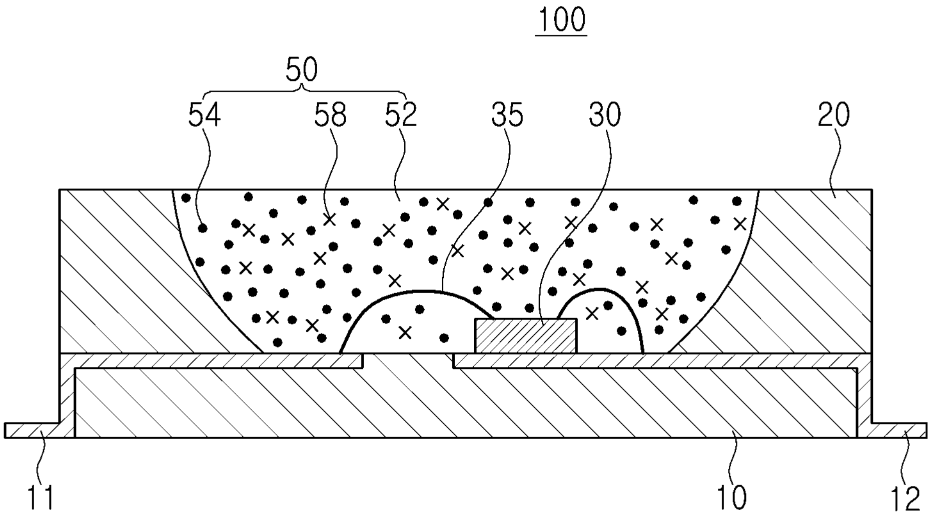
FIG. 1 is a schematic cross-sectional view illustrating a light emitting device according to an embodiment.

FIG. 1 is a schematic cross-sectional view illustrating a light emitting device according to an embodiment.

Referring to FIG. 1, a light emitting device 100 according to the present embodiment may include a package substrate 10, a light emitting diode (LED) chip 30 disposed on the package substrate 10, and a wavelength converter 50.

The light emitting device 100 may further include a pair of lead frames 11 and 12 electrically connected to the LED chip 30, a side wall reflector 20 having a cup shape, and a conductive wire 35 connecting the LED chip 30 and the lead frames 11 and 12. In this specification, the term "light emitting device" may be used as a meaning including an "LED package" or an "LED module" and a lighting device using the same.

In some embodiments, the package substrate 10 may be formed of an opaque resin or a resin having high reflectivity. For example, the package substrate 10 may include a resin containing a highly reflective powder (e.g., $TiO_2$). In some embodiments, the package substrate 10 may be formed of ceramic, which may easily dissipate heat. In some embodiments, the package substrate 10 may be a printed circuit board, and the lead frames 11 and 12 may be replaced with wiring patterns formed on the printed circuit board.

The side wall reflector 20 may be disposed on the package substrate 10 and the lead frames 11 and 12, and may have a cup-shaped cavity accommodating the LED chip 30. The sidewall reflector 20 may have a cup shape to improve light reflection efficiency, but is not limited thereto. In some embodiments, the side wall reflector 20 may be integrally formed with the package substrate 10. For example, the sidewall reflector 20 and the package substrate 10 may be formed of the same material (e.g., a resin containing a highly reflective powder) by the same process (e.g., injection molding).

A light emitting device 100 according to the present embodiment may be a light emitting device configured to emit white light.

The LED chip 30 may be configured to emit first light having a peak wavelength of 400 nm to 470 nm. In some embodiments, the first light emitted from the LED chip 30 may be blue light. For example, the blue light may have a peak wavelength of 425 nm to 465 nm. The LED chip 30 may include a semiconductor epitaxial laminate, and various structures of the LED chip 30 employable in the present embodiment will be described later. In the specification, the expression of "having a peak at (λ1) to (λ2), or "having a peak of (λ1) to (λ2)" means "having a peak whose peak wavelength is greater than or equal to (λ1) and less than or equal to (λ2)".

The wavelength converter 50 may be disposed on a light path of the LED chip 30, and may include first and second wavelength conversion materials 54 and 58 dispersed in a transparent resin 52. The first and second wavelength conversion materials may be excited by light emitted from the LED chip 30, and may convert light of different wavelengths. The first and second wavelength conversion materials 54 and 58 may be dispersed in the transparent resin 52. The transparent resin 52 may be formed of, for example, epoxy, silicone, modified silicone, a urethane resin, an oxetane resin, acrylic, polycarbonate, polyimide, and combinations thereof.

The first wavelength conversion material 54 employed in the present embodiment may convert the first light, which may be excitation light, into second light having a peak wavelength of 620 nm to 670 nm. In some embodiments, the second light may have a peak wavelength of 630 nm to 650 nm. The first wavelength conversion material 54 may include a phosphor or a quantum dot. For example, the first wavelength conversion material 54 may include (Sr,Ca) $AlSiN_3:Eu^{2+}$, $CaAlSiN_3:Eu^{2+}$, $K_xSiF_y:Mn^{4+}$ ($2 \leq x \leq 3$, $4 \leq y \leq 7$) (hereinafter also referred to as KSF), or a combination thereof.

The second wavelength conversion material 58 employed in the present embodiment may include a near-infrared phosphor emitting light in a near-infrared band. The near-infrared phosphor 58 employed in the present embodiment may greatly improve a bioenergy enhancement function in view of an ATP action spectrum (see FIG. 5). The near-infrared phosphor 58 according to the present embodiment may combine with red light to provide an emission spectrum that may cover a significant portion of the ATP action spectrum.

Figure 3:
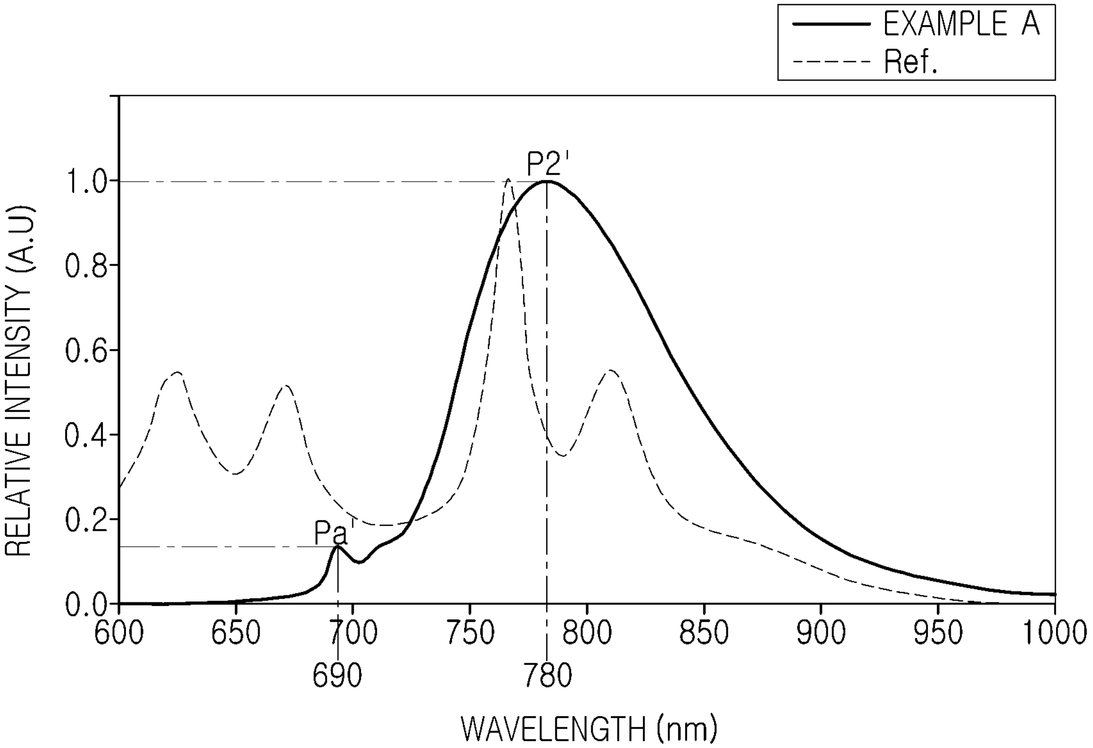
FIG. 3 is a graph illustrating an emission spectrum of a near-infrared (NIR) phosphor usable in a light emitting device according to an embodiment.
Figure 4A:
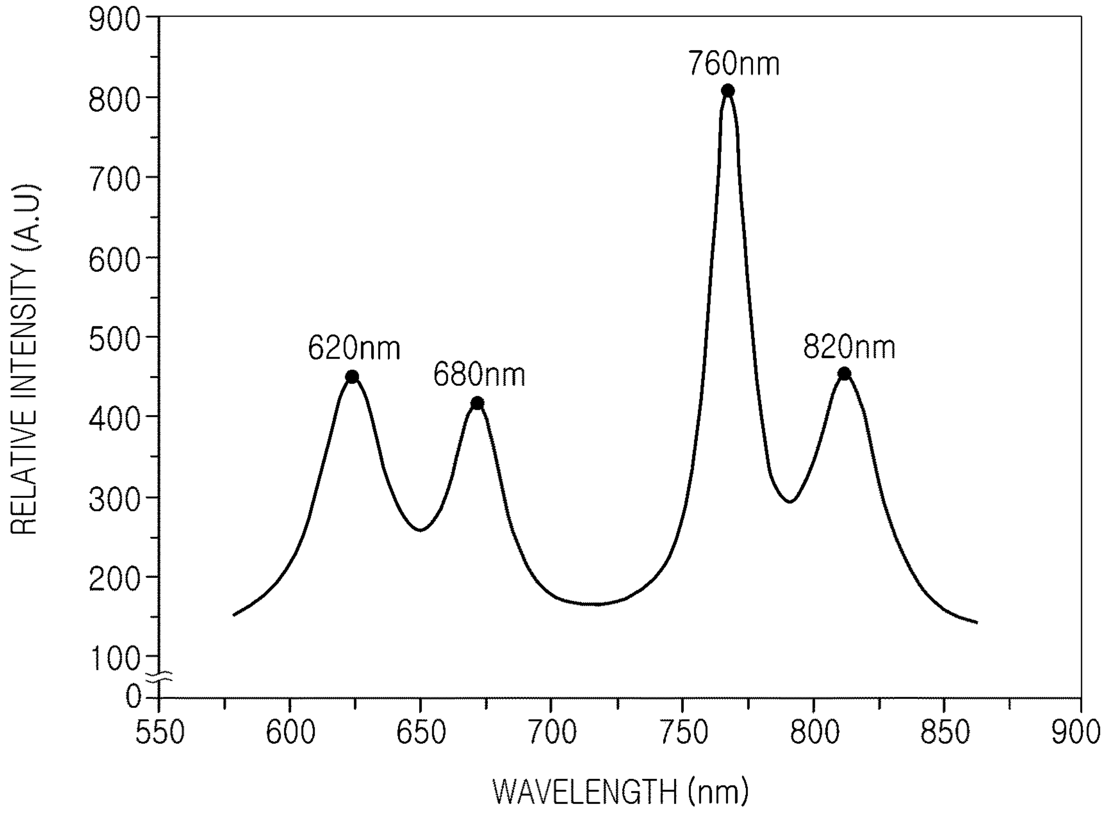
FIG. 4A is an action spectrum for stimulating a DNA synthesis rate in a cell.

First, referring to FIG. 3, the near-infrared phosphor 58 employed in the present embodiment represents an emission spectrum by excitation light. In this case, a dotted line represents an action spectrum for stimulating a DNA synthesis rate in a cell. Specifically, the spectrum indicated by the dotted line represents an absorption spectrum based on an absorbing chromophore of a cytochrome c oxidase (CCO), as illustrated in FIG. 4A (refer to FIG. 1 of the paper "Multiple Roles of Cytochrome c Oxidase in Mammalian Cells Under Action of Red and IR-A Radiation", by Tiina I. Karu).

This absorption spectrum has four significant absorption peaks (620 nm, 680 nm, 760 nm, and 820 nm) in the red to near-infrared band (see FIG. 4A). This dotted line spectrum may be also referred to as a "reference absorption spectrum (Ref.)" for convenience in this specification. As such, light in the near-infrared band may be absorbed by a cytochrome c oxidase present in an inner membrane of mitochondria to promote production of adenosine triphosphate (ATP), which is an energy source of a cell. To maximize physiological effects such as ATP action or the like, it is necessary to design a near-infrared phosphor 58 in which emission light provides an appropriate spectrum.

In an emission spectrum of the near-infrared phosphor 58 according to the present embodiment, a method of maintaining a high intensity in the near-infrared band (e.g., a band related to a third peak (760 nm) and a fourth peak (820 nm)), and lowering an intensity in a band between a second peak (e.g., 680 nm) and the third peak (e.g., 760 nm) is proposed (see FIG. 4A). Since the band between the second and third peaks has a relatively wide and relatively deep valley (i.e., a low degree of absorption), the present inventors have noted that it is necessary to lower an intensity in such a band. Through this, it is possible to provide a light emitting device improving a light biomodulation function while ensuring high efficiency.

Specifically, light (or third light) converted from the near-infrared phosphor 58 according to the present embodiment may provide an emission spectrum having a ratio of an intensity of 690 nm relative to an intensity of 780 nm of 0.3 or less. In addition, a full-width-half-maximum (FWHM) of the emission spectrum may be in the range of 90 nm to 110 nm.

Referring to FIG. 3, an emission spectrum of the third light alone (example A) may have a first peak Pa' at 670 nm to 700 nm and a second peak P2' at 740 nm to 820 nm (e.g., 760 nm to 810 nm in specific examples). In this case, a ratio of an intensity of the first peak Pa' relative to an intensity of the second peak P2' may be defined as 0.3 or less, or 0.2 or less. In addition, the above-described full-width-half-maximum condition may be defined in a spectral region related to the main second peak P2'.

As such, the near-infrared phosphor 58 according to the present embodiment may have an emission spectrum covering a significant portion of the near-infrared band of the reference absorption spectrum (Ref.). These near-infrared phosphors may include a phosphor represented by composition formula $CaAl_{(12-x-y)}Ga_yO_{19}:xCr^{3+}$, where x satisfies $0.1 \leq x \leq 0.3$ and y satisfies 1 or more (in some embodiments, 3 or more).

In general, a conventional near-infrared phosphor having a composition similar to $CaAl_{(12-x-y)}Ga_yO_{19}:xCr^{3+}$ has a relatively high ratio of an intensity of 690 nm relative to an intensity of 780 nm (e.g., 0.4 or more). In the contrast, the near-infrared phosphor 58 according to the present embodiment may use a predetermined flux in a process of manufacturing a phosphor together with the above-described composition ratio conditions to effectively lower an intensity of a band less involved in a biomodulation function. (e.g., an intensity of 690 nm) (see FIG. 3).

Figure 2:
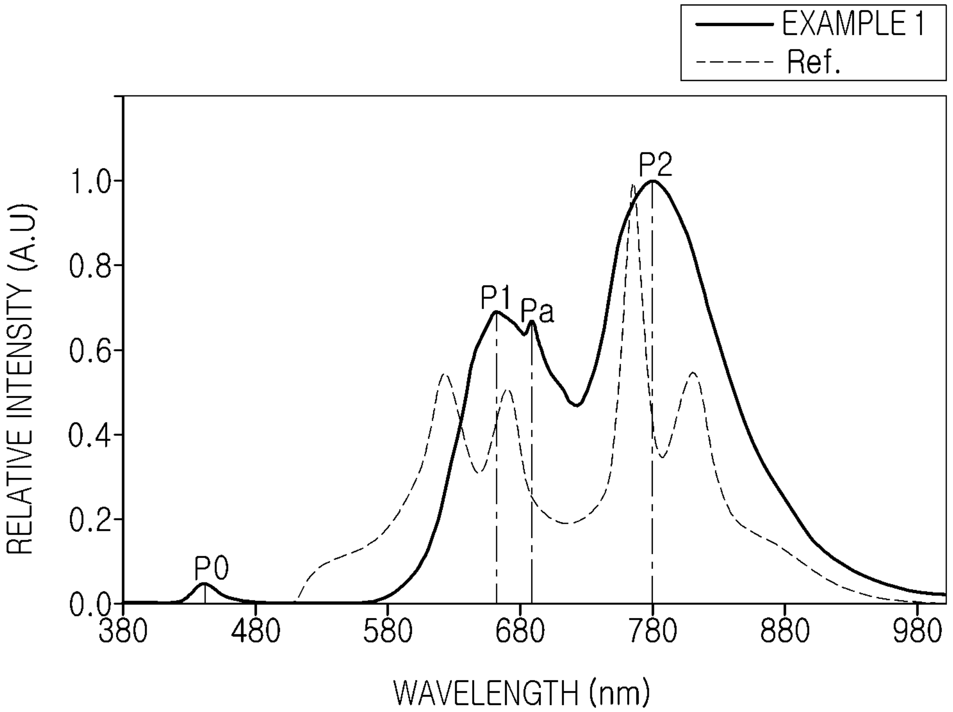
FIG. 2 illustrates an emission spectrum of light emitted from a light emitting device according to an embodiment.

As described above, a light emitting device 100 according to the present embodiment may include the first wavelength conversion material 54, together with the near-infrared phosphor 58. The second light converted by the additional first wavelength conversion material 54 may cover a visible ray band of the reference absorption spectrum. FIG. 2 illustrates an emission spectrum of light emitted from a light emitting device 100 according to the present embodiment.

Referring to FIG. 2, an emission spectrum of final light (example 1) may cover a significant portion of a reference absorption spectrum (the dotted line). Specifically, a near-infrared band of the reference absorption spectrum may be covered by third light of a near-infrared phosphor 58 according to the present embodiment, and a visible-ray band (mainly a red band) of the reference absorption spectrum may be covered by second light of a first wavelength conversion material 54, thereby providing the final light with excellent biomodulation effect in high efficiency.

The final light (example 1) may have an emission spectrum, as illustrated in FIG. 2, by combining the second light of the first wavelength conversion material 54 and the third light of the second wavelength conversion material 58. The emission spectrum of the final light may have a first peak P1 at 630 nm to 680 nm and a second peak P2 at 740 nm to 820 nm (e.g., 760 nm to 810 nm in specific examples). In the present embodiment, the first peak P1 may be about 660 nm, and the second peak P2 may be about 780 nm. To efficiently cover a reference absorption spectrum (Ref.), the first peak P1 and the second peak P2 may have appropriate ranges. A ratio of an intensity of the first peak P1 relative to an intensity of the second peak P2 may be 0.8 or less, or it may be 0.4 or less, or it may be 0.4 to 0.8. In the present embodiment, the peak intensity ratio of the final light may be about 0.65. The emission spectrum of the final light may be determined by peaks, full-width-half-maximums, or the like of the second light and the third light, respectively.

In the present embodiment, as illustrated in FIG. 2, the emission spectrum of the final light (example 1) may have a sub-peak Pa between the first peak P1 and a valley between the first and second peaks P1 and P2. The sub-peak Pa may be located between 670 nm and 700 nm. In the present embodiment, the sub-peak Pa may be about 690 nm. This sub-peak Pa may be formed by a peak Pa' in the third light of the near-infrared phosphor 58. In some embodiments, when the peak Pa' of the third light is small, the sub-peak Pa may hardly appear in the emission spectrum of the final light.

Final light of a light emitting device 100 according to the present embodiment may be red light. A main portion of excitation light of an LED chip 30 may be converted by the first wavelength conversion material 54 and the near-infrared phosphor 58, and a portion of the excitation light which is not converted may be very small. As in the present embodiment, a peak P0 caused by the excitation light may have a very low intensity (e.g., 0.1 or less, relative to an intensity of the third peak). Therefore, a color of the final light may be determined by the third light in the visible ray band, and the red light may be emitted. The color of the final light may be slightly changed, depending on efficiencies and compounding amounts of the first wavelength conversion material 54 and the near-infrared phosphor 58. In the present embodiment, the final light, which may be red light, may be implemented by significantly increasing the compounding amounts of the first wavelength conversion material 54 and the near-infrared phosphor 58.

The present embodiment is illustrated as including $CaAl_{(12-x-y)}Ga_yO_{19}:xCr^{3+}$ ($0.1 \le x \le 0.3$, $y \ge 1$) as a near-infrared phosphor, but, in some embodiments, may be configured to further include an additional near-infrared phosphor. The additional near-infrared phosphor may provide light having a peak wavelength of 740 nm to 900 nm, and may be included in a relatively small amount. The additional near-infrared phosphor may include, for example, $Lu_3Al_5O_{12}:Ce^{3+}, Cr^{3+}$, $La_3MgZrO_6:Cr^{3+}$, $LiInSi_2O_6:Cr^{3+}$, $LiZnSnO:Cr^{3+}$, $ScBO_3:Cr^{3+}$, or a combination thereof.

In this manner, a near-infrared phosphor according to the present embodiment may be provided to greatly improve a bioenergetic enhancing function in terms of an ATP action spectrum. The light emitting device including the near-infrared phosphor according to the present embodiment may have a light emitting spectrum that may cover a significant portion of the ATP action spectrum. Therefore, it is possible to provide a high-efficiency light emitting device having excellent performance in terms of energy growth of a cell such as collagen production and anti-inflammation.

Hereinafter, emission spectrum conditions required for the light emitting device according to the present embodiment will be described in detail.

As described above as a reference absorption spectrum, FIG. 4A illustrates an action spectrum for stimulating a DNA synthesis rate in a cell, as an absorption spectrum using an absorption chromophore of a cytochrome c oxidase. Specifically, light in the near-infrared band may be absorbed by a cytochrome c oxidase present in an inner membrane of mitochondria to promote production of adenosine triphosphate (ATP), which is an energy source of a cell. This action spectrum has four absorption peaks (620 nm, 680 nm, 760 nm, and 820 nm) in the red to near-infrared region.

Despite this action spectrum, a spectrum that affects actual ATP production may be changed, depending on skin permeability. Such skin permeability may be defined by a skin penetration depth according to a wavelength.

Figure 4B:
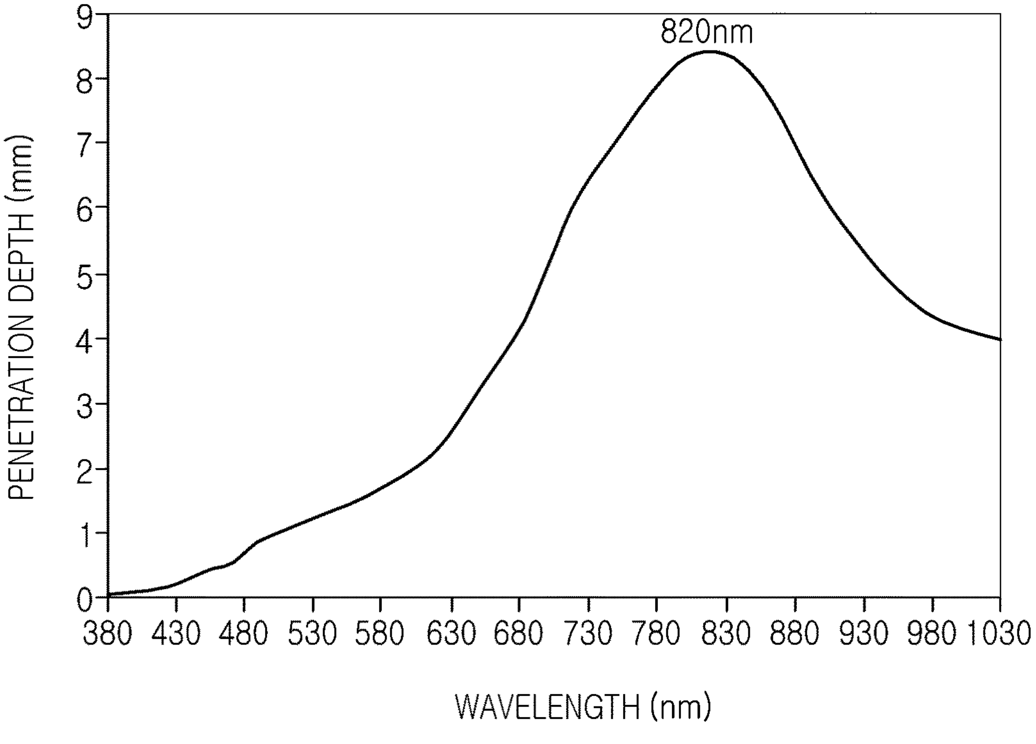
FIG. 4B is a graph illustrating a skin penetration depth according to a wavelength.

Referring to FIG. 4B, a skin penetration depth according to a wavelength may have a peak in an 820 nm band, and may be relatively high in an infrared ray band, but may be low in a visible ray band.

Figure 5:
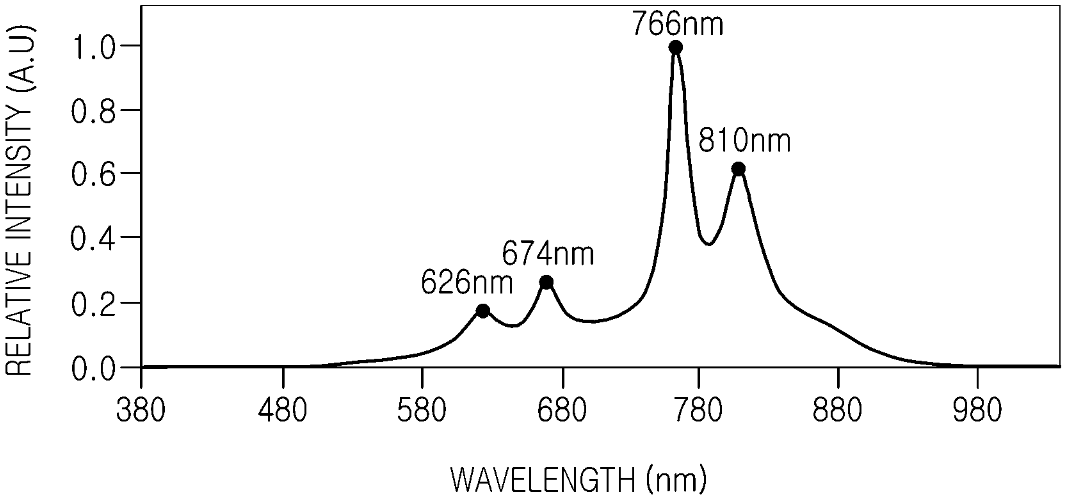
FIG. 5 illustrates an ATP action spectrum utilized in an embodiment.

In the present specification, a spectrum calculated by multiplying the action spectrum of the cytochrome c oxidase (see FIG. 4A) by the skin penetration depth according to the wavelength (see FIG. 4B) may be defined as "ATP action spectrum," and this ATP action spectrum is illustrated in FIG. 5.

Referring to FIG. 5, an ATP action spectrum may have peak wavelengths similar to four absorption peaks of an action spectrum of a cytochrome c oxidase, but the four peaks may be slightly shifted to peaks of 626 nm, 674 nm, 766 nm, and 810 nm, respectively, due to skin permeability. In addition, the ATP action spectrum may be relatively low at 626 nm and 674 nm of a visible ray band and a band adjacent thereto, and may be relatively high at 766 nm and 810 nm of a near-infrared band and a band adjacent thereto. As such, the ATP action spectrum illustrated in FIG. 5 represents an action spectrum that may be absorbed by the cytochrome c oxidase in a cell through a human skin and may substantially contribute to promotion of ATP production, which is an energy source of a cell.

A light emitting device according to the present embodiment may emit final light configured to cover a substantial portion of the ATP action spectrum illustrated in FIG. 5. An emission spectrum of the final light (e.g., see FIG. 2) may cover more than 60% of the ATP action spectrum. In some embodiments, the emission spectrum of final light may cover 70% or more of the ATP action spectrum, even 75% or more. Therefore, a light emitting device according to the present embodiment may provide functional light with high efficiency for promoting production of ATP, which is an energy source of a cell. Final light of the light emitting device can have an emission spectrum in which a ratio of an area of 550 nm or less relative to an area of 550 nm or more is 2% or less.

Figure 6A:
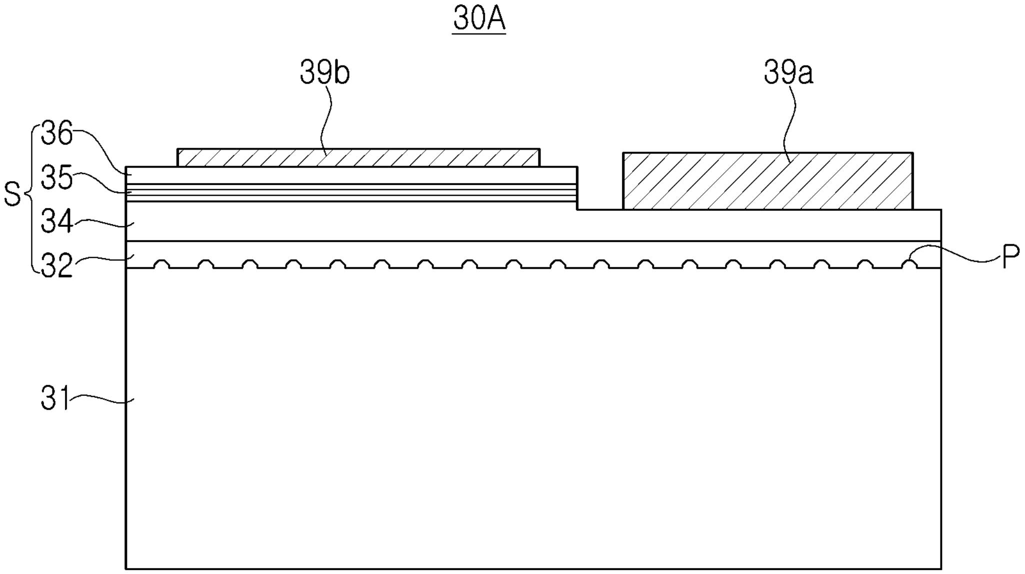
FIGS. 6A and 6B are schematic cross-sectional views illustrating a light emitting diode chip employed in a light emitting device according to an embodiment.
Figure 6B:
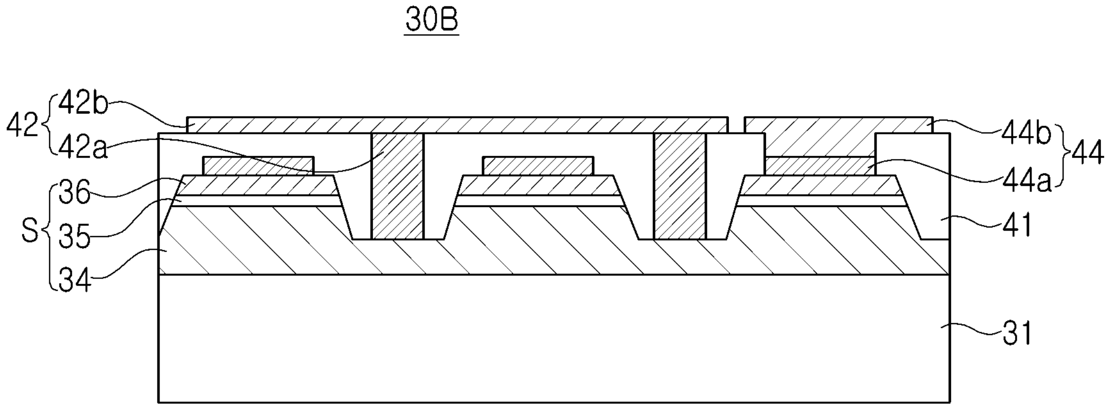

FIGS. 6A and 6B are schematic cross-sectional views illustrating a light emitting diode chip employed in a light emitting device according to an embodiment.

Referring to FIG. 6A, an LED chip 30A employed in the present embodiment may include a substrate 31 and a semiconductor stack S disposed on the substrate 31. The semiconductor stack S may include a first conductivity-type semiconductor layer 34, an active layer 35, and a second conductivity-type semiconductor layer 36, sequentially disposed on the substrate 31. A buffer layer 32 may be additionally disposed between the substrate 31 and the first conductivity-type semiconductor layer 34.

The substrate 31 may be an insulating substrate such as a sapphire substrate, but is not limited thereto, and the substrate 31 may be a conductive substrate or a semiconductor substrate, in addition to the insulating substrate. For example, the substrate 31 may be formed of SiC, Si, $MgAl_2O_4$, MgO, $LiAlO_2$, $LiGaO_2$, or GaN, in addition to sapphire. An irregularity P may be formed on an upper surface of the substrate 31. The irregularity P may improve the quality of a single crystal grown while improving light extraction efficiency.

The buffer layer 32 may include undoped $In_xAl_yGa_{1-x-y}N$ ($0 \le x \le 1$, $0 \le y \le 1$). For example, the buffer layer 32 may be formed of GaN, AlN, AlGaN, or InGaN. As necessary, a plurality of layers may be combined, or a composition thereof may be gradually changed and used.

The first conductivity-type semiconductor layer 34 may be a nitride semiconductor satisfying n-type $In_xAl_yGa_{1-x-y}N$ ($0 \le x < 1$, $0 \le y < 1$, $0 \le x+y < 1$), and an n-type impurity may be Si. For example, the first conductivity-type semiconductor layer 34 may include n-type GaN. The second conductivity-type semiconductor layer 36 may be a nitride semiconductor layer satisfying p-type $In_xAl_yGa_{1-x-y}N$ ($0 \le x < 1$, $0 \le y < 1$, $0 \le x+y < 1$), and a p-type impurity may be Mg. For example, the second conductivity-type semiconductor layer 36 may be implemented as a single-layer structure, but may have a multilayer structure having different compositions, as in the present example.

The active layer 35 may have a multiple quantum well (MQW) structure in which a quantum well layer and a quantum barrier layer are alternately stacked. For example, the quantum well layer and the quantum barrier layer may be $In_xAl_yGa_{1-x-y}N$ ($0 \le x \le 1$, $0 \le y \le 1$, $0 \le x+y \le 1$) having different compositions. In a specific example, the quantum well layer may be $In_xGa_{1-x}N$ ($0 < x \le 1$), and the quantum barrier layer may be GaN or AlGaN. Each of the quantum well layer and the quantum barrier layer may have a thickness in the range of 1 nm to 50 nm. The active layer 35 is not limited to the multiple quantum well structure, and may have a single quantum well structure.

First and second electrodes 39*a* and 39*b* may be respectively disposed on a mesa-etched region of the first conductivity-type semiconductor layer 34 and the second conductivity-type semiconductor layer 36, to be located on the same surface. The first electrode 39*a* is not limited thereto, but may include a material such as Ag, Ni, Al, Cr, Rh, Pd, Ir, Ru, Mg, Zn, Pt, Au, or the like, and may be employed as a single layer or a structure of two or more layers. In some embodiments, the second electrode 39*b* may be a transparent electrode such as a transparent conductive oxide or a transparent conductive nitride, or may include graphene. The second electrode 39*b* may include at least one of Al, Au, Cr, Ni, Ti, and Sn.

Referring to FIG. 6B, it can be understood that an LED chip 30B according to the present embodiment may be similar to the LED chip 30A illustrated in FIG. 6A, except for an electrode structure and a structure related thereto. Descriptions of the components of the present embodiment may refer to descriptions of the same or similar components as the LED chip 30A illustrated in FIG. 6A, unless otherwise stated.

The LED chip 30B may include first and second electrodes 42 and 44 respectively connected to first and second conductivity-type semiconductor layers 34 and 36. The first electrode 42 may include a connection electrode portion 42*a* passing through the second conductivity-type semiconductor layer 36 and the active layer 35 and connected to the first conductivity-type semiconductor layer 34, and a first electrode pad 42*b* connected to the connection electrode portion 42*a*. The connection electrode portion 42*a* may have a structure such as a conductive via. The connection electrode portion 42*a* may be surrounded by an insulating portion 41, to be electrically separated from the active layer 35 and the second conductivity-type semiconductor layer 36. The connection electrode portion 42*a* may be disposed in a region in which a semiconductor stack S may be etched. The number, shapes, or pitches of the connection electrode portions 42*a*, or a contact area between the first conductivity-type semiconductor layer 34 and the connection electrode portions 42*a*, or the like may be appropriately designed to lower contact resistance. In addition, the connection electrode portions 42*a* may be arranged in rows and columns on the semiconductor stack S to improve current flow. The second electrode 44 may include an ohmic contact layer 44*a* and a second electrode pad 44*b* on the second conductivity-type semiconductor layer 36.

The connection electrode portion 42*a* and the ohmic contact layer 44*a* may include a single-layer or a multilayer structure of a conductive material having ohmic characteristics with the first and second conductivity-type semiconductor layers 34 and 36, respectively. For example, the connection electrode portion 42*a* and the ohmic contact layer 44*a* may be formed by depositing or sputtering at least one of a metal such as Ag, Al, Ni, or Cr, and a transparent conductive oxide (TCO) such as ITO.

The first and second electrode pads 42*b* and 44*b* may be connected to the connection electrode portion 42*a* and the ohmic contact layer 44*a*, respectively, and may function as external terminals of the LED chip 30B. For example, the first and second electrode pads 42*b* and 44*b* may be formed of Au, Ag, Al, Ti, W, Cu, Sn, Ni, Pt, Cr, NiSn, TiW, AuSn, or eutectic metals thereof.

The first and second electrodes 42 and 44 may be disposed in the same direction, and may be mounted on a lead frame or the like in a so-called flip chip form. The two electrodes 42 and 44 may be electrically separated from each other by an insulating portion 41. As the insulating portion 41, any material having electrical insulating properties may be used, and any object having electrical insulating properties may be employed, but a material having low light absorption may be used. For example, silicon oxide or silicon nitride may be used. As necessary, a light reflection structure may be formed by dispersing light reflection powders in a light transmission material. Alternatively, the insulating portion 41 may have a multilayer reflective structure in which a plurality of insulating films having different refractive indices are alternately stacked. For example, the multilayer reflective structure may be a distributed Bragg reflector (DBR) in which a first insulating film having a first refractive index and a second insulating film having a second refractive index are alternately stacked.

In the multilayer reflective structure, a plurality of insulating films having different refractive indices are repeatedly stacked 2 to 100 times. For example, the plurality of insulating films may be repeatedly stacked 3 to 70 times, and may be repeatedly stacked 4 to 50 times. The plurality of insulating films of the multilayer reflective structure may be oxides or nitrides such as $SiO_2$, SiN, $SiO_xN_y$, $TiO_2$, $Si_3N_4$, $Al_2O_3$, TiN, AlN, $ZrO_2$, TiAlN, TiSiN, or the like, or combinations thereof. A refractive index of the first insulating film and a refractive index of the second insulating film may be determined in the range of about 1.4 to about 2.5, and may be smaller than a refractive index of the first conductivity-type semiconductor layer 34 and a refractive index of a substrate 31, but may be smaller than the refractive index of the first conductivity-type semiconductor layer 34 and larger than the refractive index of the substrate 31. The above-described LED chips 30A and 30B may be used as a blue light emitting diode 30 of the light emitting device 100.

A light emitting device according to the present embodiment may employ various other structured LED chips, in addition to the above-described structured LED chip, as an excitation light source such as a near-infrared phosphor for promoting ATP production.

As described above, a near-infrared phosphor according to the present embodiment may have an emission spectrum covering a significant portion of a near-infrared band of a reference absorption spectrum. The near-infrared phosphor may include a phosphor represented by composition formula $CaAl_{(12-x-y)}Ga_yO_{19}:xCr^{3+}$, where x satisfies $0.1 \le x \le 0.3$ and y satisfies 1 or more.

Figure 7:
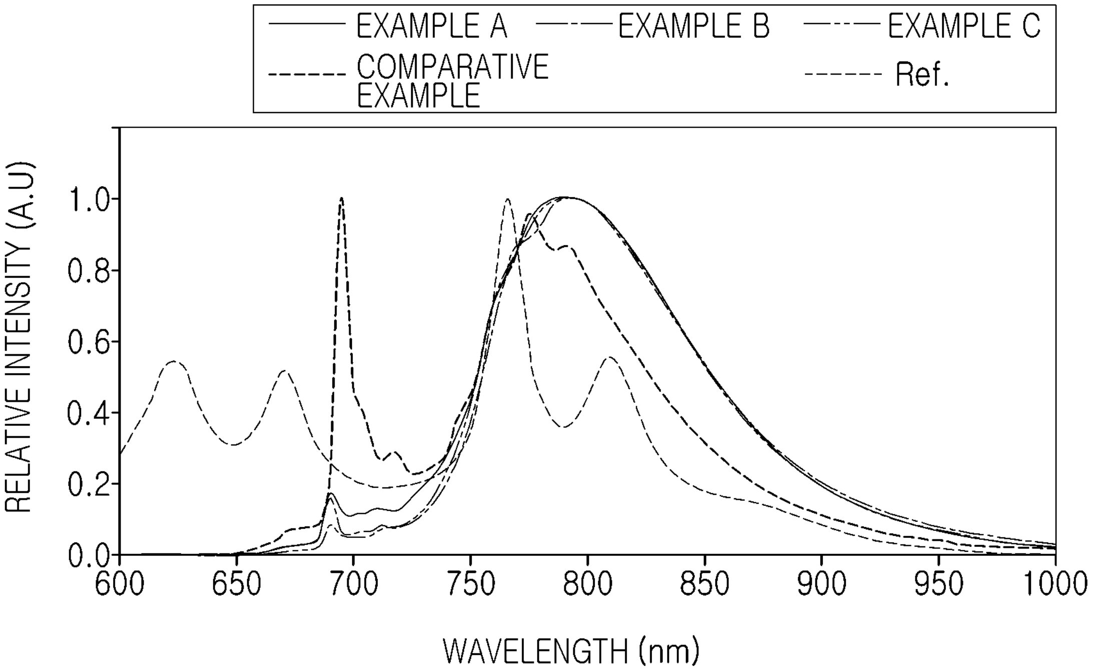
FIG. 7 illustrates emission spectra of near-infrared phosphors according to examples and a comparative example of the present disclosure.

A near-infrared phosphor according to the present embodiment may provide an emission spectrum optimized for a biomodulation function by using a predetermined flux in the phosphor manufacturing process together with these composition ratio conditions. FIG. 7 illustrates emission spectra of near-infrared phosphors according to examples and comparative example of the present disclosure.

To prepare a near-infrared phosphor represented by compositional formula $CaAl_{7.8}$, $Ga_4O_{19}:0.2Cr^{3+}$, raw materials were mixed in the same mixing ratio to prepare mixtures. The mixtures of the same mixing ratio were sintered at the same temperature to prepare phosphors, but the presence or absence of fluxes in the mixtures before sintering, and a type of a flux material was varied as illustrated in Table 1 below. For example, $BaF_2$, $SrF_2$, and $CaF_2$ were respectively mixed as fluxes in mixtures of raw materials in examples A, B, and C in an amount of 3 wt % to 5 wt % based on the total amount of the mixtures, and no flux was used in the comparative example.

TABLE 1

| | Flux | Peak Intensity Ratio |
|---|---|---|
| Example A | $BaF_2$ | 0.17 |
| Example B | $SrF_2$ | 0.16 |
| Example C | $CaF_2$ | 0.09 |
| Comparative Example | X | 1.04 |

Near-infrared phosphors were prepared by mixing mixtures according to examples A to C and the comparative example, and an emission spectrum of light emitted from each of the near-infrared phosphors was measured using a 445 nm LED chip as excitation light, and is illustrated in FIG. 7.

In the emission spectrum of the near-infrared phosphors, an intensity of a first peak at 670 nm to 700 nm and an intensity of a second peak at 740 nm to 820 nm were measured, and a ratio of the intensity of the first peak relative to the intensity of the second peak was illustrated in Table 1.

In the comparative example prepared without using a flux, the intensity of the first peak was relatively high, and in examples A to C using fluxes such as $SrF_2$ and $CaF_2$, the intensity of the first peak was significantly lowered.

Referring to FIG. 7, emission spectra according to examples A to C have a full-width-half-maximum of 90 nm or more and 110 nm or less, and have a spectrum sufficiently covering a near-infrared band of a reference absorption spectrum (Ref.). An emission spectrum according to the comparative example was found to have a full-width-half-maximum of 75 nm.

As described above, near-infrared phosphors according to the present examples (examples A, B, and C) may be prepared using an appropriate flux, thereby providing a near-infrared phosphor that emits light capable of sufficiently covering a near-infrared band while greatly lowering a peak intensity (a first peak) in a band having a relatively wide and relatively low absorption (e.g., a band between a second peak and a third peak) in the reference absorption spectrum (Ref.). Through this, it is possible to provide a high-efficiency light emitting device improving a light biomodulation function.

To confirm the improved effect of the light emitting device according to the present example, different types of functional light sources were manufactured, and the light biomodulation function was compared and evaluated by various types of cell experiments.

A light emitting device according to the present example was manufactured by combining a 445 nm LED chip with a near-infrared phosphor (780 nm) and a red phosphor (660 nm) according to example C among the previous embodiments, similar to the structure illustrated in FIG. 1.

Other types of light sources were prepared as follows. In particular, comparative examples 2 and 3 were configured to cover the main band of the reference absorption spectrum (Ref.) using an existing light source (a phosphor or an LED chip) of a specific wavelength. In particular, a light source of comparative example 3 included four LED chips emitting light with wavelengths, similar to the four peak wavelengths of the reference absorption spectrum.

Comparative example 1: White Light Emitting Device Corresponding to Common Illumination Light Source.

Comparative example 2: LED chip with 760 nm peak wavelength.

Comparative example 3: Four LED chips emitting light having a peak wavelength of 620 nm, 660 nm, 760 nm, and 820 nm, respectively.

Figure 8:
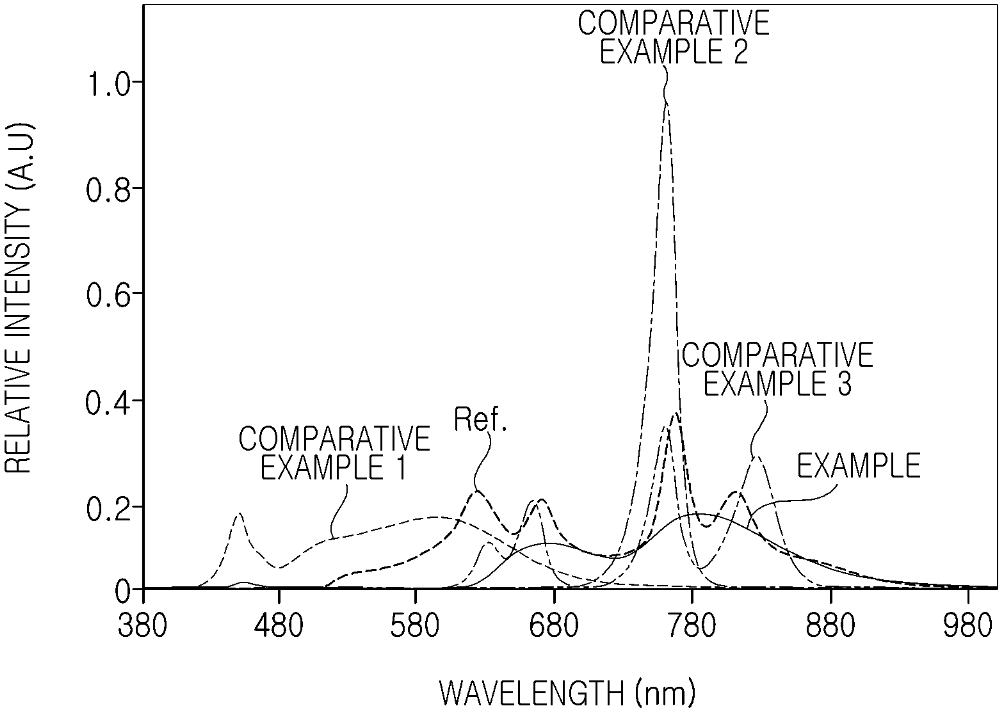
FIG. 8 is emission spectra of light emitting devices according to examples and comparative examples of the present disclosure.

FIG. 8 illustrates emission spectra of the example and comparative examples 1 to 3 together with the reference absorption spectra (Ref). In this case, the spectra of the example and comparative examples 2 and 3 were expressed in terms of the same amount of light (photon energy=6 mW/$cm^2$).

First, to verify a skin wrinkling effect of the light emitting device according to the present example, an experiment for collagen synthesis expression was conducted. In the present experiment, skin dermal cells (HS68) were irradiated with the same amount of light (6 mW/$cm^2$) for 4 hours (86 J/$cm^2$), and results of collagen synthesis (m-RNA) were compared, and have been illustrated in FIG. 9. In this case, as another comparative example, a negative control was a result of irradiation with a UV light source (UVB) under the same conditions, and a positive control was a result of treatment with retinoic acid (1 μM), which is known as a wrinkle treatment.

Figure 9:
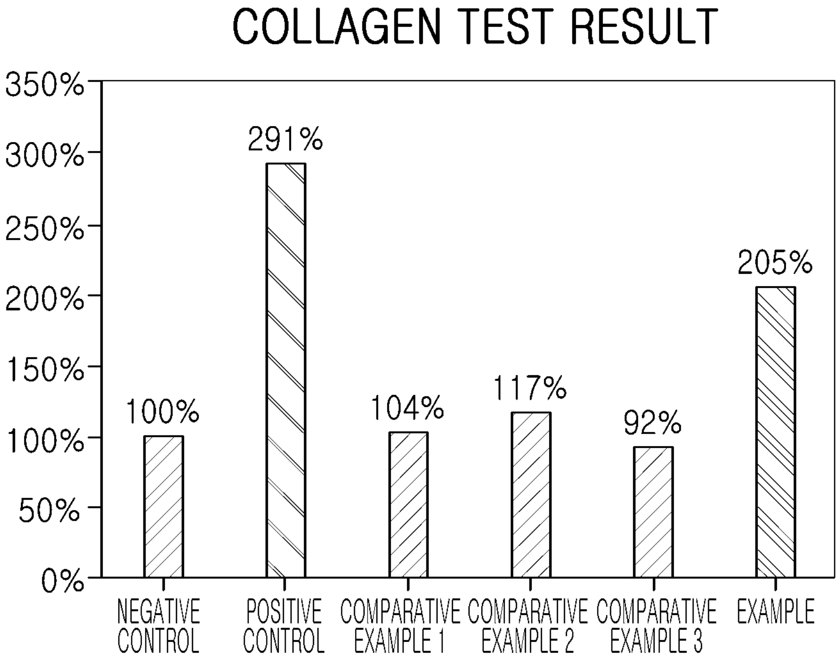
FIG. 9 is a graph illustrating collagen production results with light according to examples and comparative examples of the present disclosure.

Referring to FIG. 9, based on 100% of a negative control, comparative examples 1 to 3 showed collagen synthesis results of 104%, 117%, and 92%, respectively, whereas results according to the example were 205%, which was almost twice that of comparative examples. As a result of the collagen synthesis test, it was confirmed that light of the light emitting device according to the present example has an excellent effect on skin wrinkle improvement, as compared to other light sources.

Next, the present experiment was conducted to verify an ATP synthesis effect of a light emitting device according to the present example. In the present experiment, skin dermal cells (HS68) were irradiated with a light source with the same amount of light (6 mW/$cm^2$) for 4 hours (86 J/$cm^2$), and then an amount of ATP synthesis was measured, and has been illustrated in FIG. 10.

Figure 10:
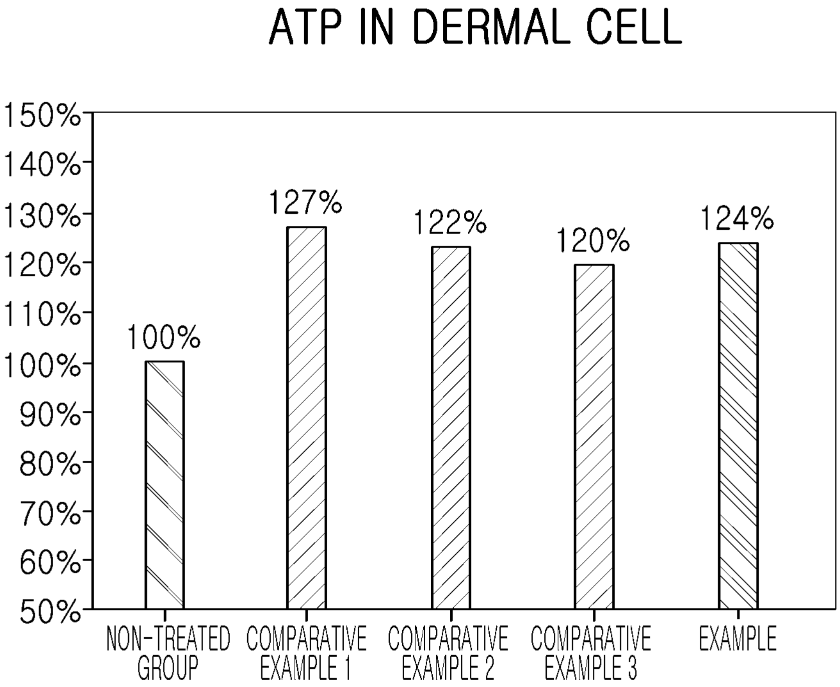
FIG. 10 is a graph illustrating ATP synthesis results in dermal cells with light according to examples and comparative examples of the present disclosure.

Referring to FIG. 10, based on 100% of a non-treated group, ATP synthesis amounts in comparative examples 1 to 3 were measured as 127%, 122%, and 120%, respectively, and results according to the present example were similarly measured at 124%. Overall, since all examples were prepared in consideration of the reference absorption spectrum, a bioimproving effect of about 20% to 33% was confirmed.

In addition, in the present experiment, to verify an antioxidant effect of a light emitting device according to the present example, a reactive oxygen species (ROS) inhibitory effect test was conducted. In the present experiment, as in the previous experiments, each light source was irradiated with the same amount of light (6 mW/$cm^2$) for 4 hours (86 J/$cm^2$) to skin dermal cells (HS68), and then ROS inhibition results were measured, and have been illustrated in FIG. 11. In this case, as another comparative example, a negative control was a result of treatment with $H_2O_2$ (900 μM), and a positive control was a result of treatment with ascorbic acid (100 μM), which is known as an antioxidant.

Figure 11:
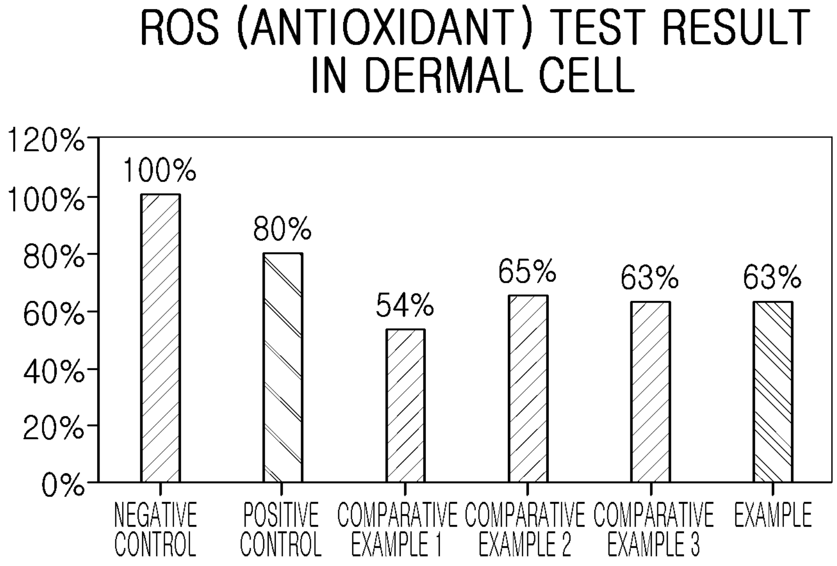
FIG. 11 is a graph illustrating antioxidant results in dermal cells with light according to examples and comparative examples of the present disclosure.

Referring to FIG. 11, based on 100% of a negative control, comparative examples 1 to 3 showed results of 54%, 65%, and 63%, respectively, and the result according to the present example was similarly found to be 63%.

Next, to verify an anti-inflammatory effect of a light emitting device according to the present example, 1-cytokines (IL-6) and 2-cytokines (IL-8) were tested. In the present experiment, as in the previous experiments, each light source was irradiated with the same amount of light (6 mW/$cm^2$) for 4 hours (86 J/$cm^2$) to the skin dermal cells (HS68), and then the anti-inflammatory results were measured, and have been illustrated in FIGS. 12A and 12B, respectively. In this case, as another comparative example, a negative control was a result of treatment with lipopolysaccharide (LPS) (5 ng/mL), and a positive control was a result of treatment with retinoic acid (1 μM).

Figure 12A:
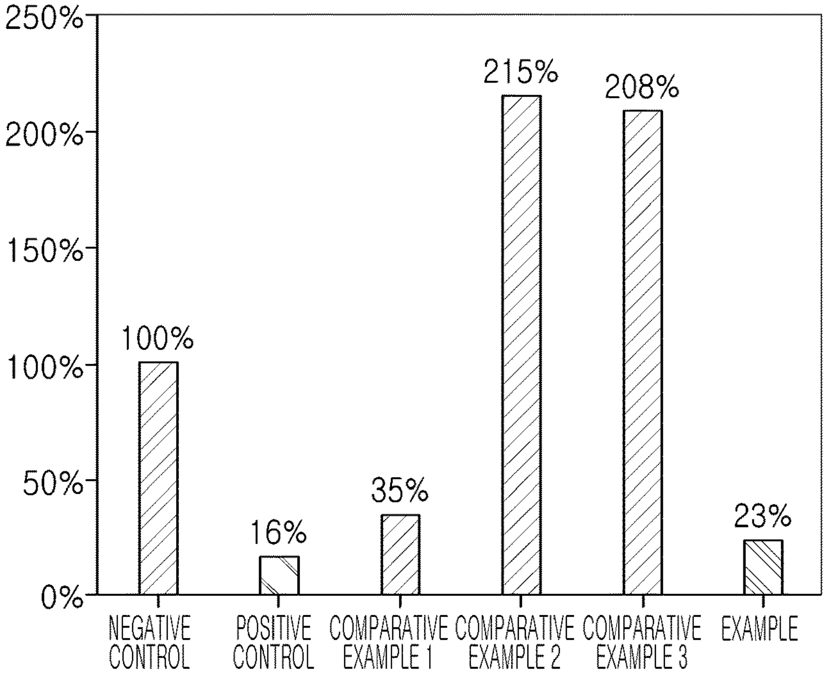
FIGS. 12A and 12B are graphs illustrating anti-inflammatory results (IL-6 and IL-8) in dermal cells with light according to examples and comparative examples of the present disclosure.

Referring to FIG. 12A, based on 100% of a non-treated group, results according to comparative examples 2 and 3 increased to 215% and 208%, respectively, whereas results according to the present example were similar to comparative example 1 and were greatly suppressed to 23%.

Figure 12B:
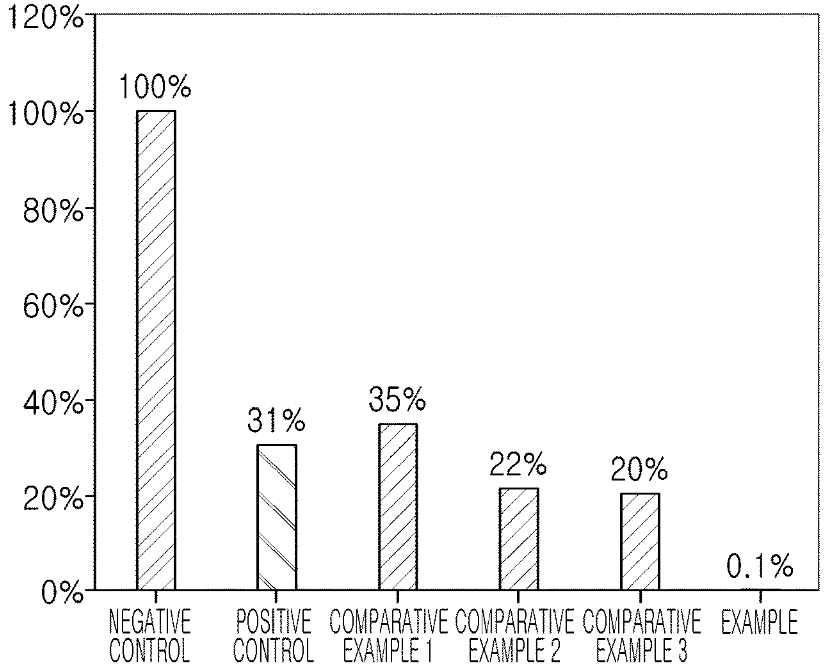

In addition, referring to FIG. 12B, based on 100% of a non-treated group, results according to comparative examples 1, 2 and 3 decreased to 35%, 22%, and 20%, respectively. The results according to the present example were significantly reduced to about 0.1%, confirming an excellent anti-inflammatory effect.

As such, a light emitting device using a near-infrared phosphor according to the present example provides a light emitting spectrum that may cover a significant portion of an ATP action spectrum, thereby greatly improving various bioenergy enhancing functions such as collagen production and anti-inflammatory functions.

Figure 13:
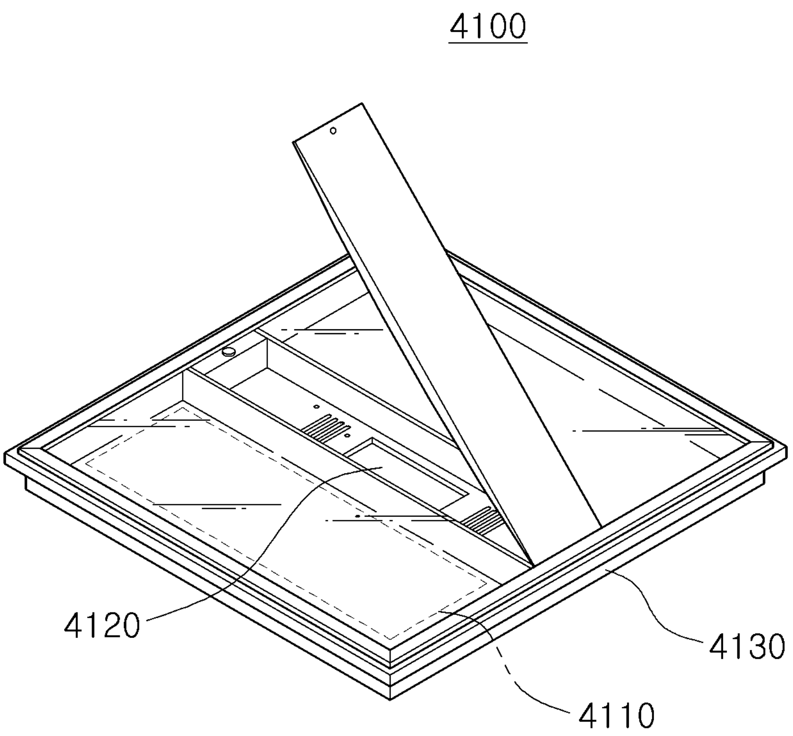
FIG. 13 is a perspective view schematically illustrating a flat lighting device according to an embodiment.
Figure 14:
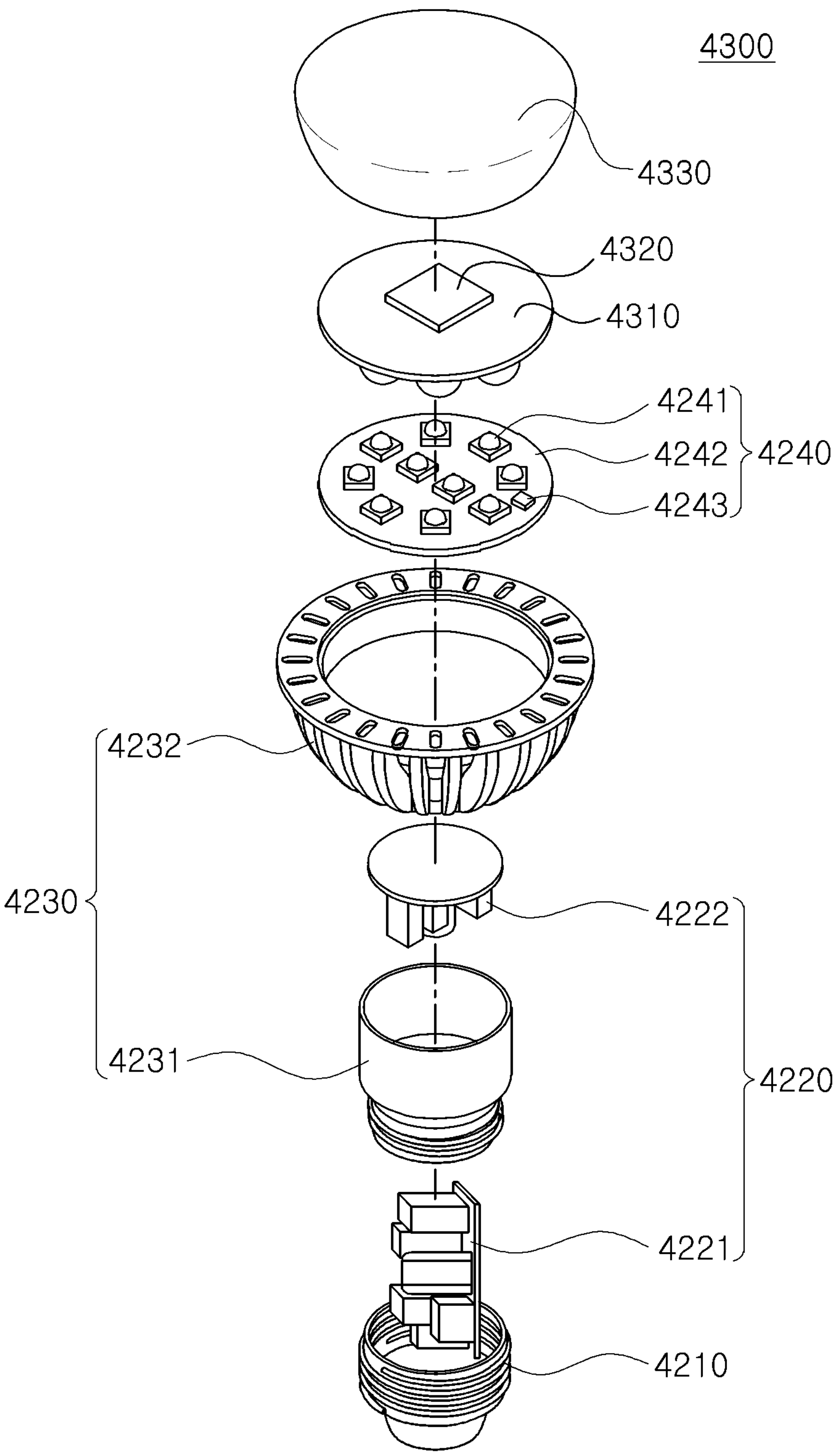
FIG. 14 is an exploded perspective view illustrating a bulb-type lighting device according to an embodiment.

FIG. 13 is a perspective view schematically illustrating a flat lighting device according to an embodiment, and FIG. 14 is an exploded perspective view illustrating a bulb-type lighting device according to an embodiment.

Referring to FIG. 13, a flat lighting device 4100 may include a light source module 4110, a power supply 4120, and a housing 4130. The power supply 4120 may include a driving control unit.

The light source module 4110 may include a light source array, and may be formed to achieve a planar shape as a whole. A light source constituting the light source module 4110 may include, for example, a light emitting device 100, as illustrated in FIG. 1.

The power supply 4120 may be configured to supply power to the light source module 4110. The housing 4130 may have an accommodation space such that the light source module 4110 and the power supply 4120 are accommodated therein, and may be formed to have one open side surface with a hexahedral shape opened in a lateral direction, but is not limited thereto. The light source module 4110 may be disposed to emit light toward the one open side surface of the housing 4130. Unlike the present example, at least a portion of phosphors among wavelength conversion materials employed in a white light emitting device may be disposed in other components (e.g., a light guide plate, a diffuser plate, and a lens) of the lighting device 4100, other than the white light emitting device.

FIG. 14 is an exploded perspective view illustrating a bulb-type lighting device according to an embodiment.

Referring to FIG. 14, a bulb-shaped lighting device 4300 may include a socket 4210, a power supplier 4220, a heat dissipation portion 4230, a light source module 4240, and an optical unit 4330.

The socket 4210 may be configured to replace an existing lighting device. Power supplied to the lighting device 4300 may be applied through the socket 4210. As illustrated, the power supplier 4220 may be separately assembled into a first power supplier 4221 and a second power supplier 4222. The heat dissipation portion 4230 may include an internal dissipation portion 4231 and an external dissipation portion 4232, and the internal dissipation portion 4231 may be directly connected to the light source module 4240 and/or the power supplier 4220, through which heat may be transferred to the external dissipation portion 4232. The lens-type optical unit 4330 may be configured to evenly disperse light emitted from the light source module 4240.

The light source module 4240 may receive power from the power supplier 4220, and may emit light to the lens-type optical unit 4330. The light source module 4240 may include at least one light source 4241, a circuit board 4242, and a controller 4243, and the controller 4243 may store driving information of the light source 4241. The light source 4241 constituting the light source module 4240 may include, for example, a light emitting device 100, as illustrated in FIG. 1.

In the lighting device 4300 according to the present example, a reflector 4310 may be included above the light source module 4240, and the reflector 4310 may evenly spread light from the light source in lateral and rear directions, to reduce glare.

A communication module 4320 may be mounted on the top of the reflector 4310, and home-network communications may be implemented by the communication module 4320. For example, the communication module 4320 may be a wireless communication module using Zigbee®, Wi-Fi, or Li-Fi, and may control lighting installed indoors and outdoors, such as turning on/off of a lighting device, adjustment of brightness, or the like by a smartphone or a wireless controller. In addition, by using a Li-Fi communication module using a visible light wavelength of a lighting device installed indoors and outdoors, it is possible to control an electronic product and an automobile system indoors and outdoors, such as a TV, a refrigerator, an air conditioner, a door lock, an automobile, or the like. The reflector 4310 and the communication module 4320 may be covered by the lens-type optical unit 4330.

A near-infrared phosphor according to the present example may greatly improve a bioenergy enhancing function in terms of an ATP action spectrum. A light emitting device using a near-infrared phosphor according to the present example provides an emission spectrum that may cover a significant portion of an ATP action spectrum, thereby providing excellent effects in terms of cell energy growth such as collagen production and anti-inflammatory effects.

Various advantages and effects of the present disclosure are not limited to the above, and will be more easily understood through the description of specific embodiments of the present disclosure.

While example embodiments have been illustrated and described above, it will be apparent to those skilled in the art that modifications and variations could be made without departing from the scope of the present disclosure as defined by the appended claims.

What is claimed is:

1. A light emitting device comprising:

a light emitting diode chip configured to emit first light having a peak wavelength of 400 nm to 470 nm;

a wavelength conversion material converting a portion of the first light into second light having a peak wavelength of 620 nm to 670 nm; and a near-infrared phosphor configured to convert a portion of the first light into third light having a peak wavelength of 740 nm to 820 nm, wherein the near-infrared phosphor comprises a phosphor represented by composition formula $CaAl_{(12-x-y)}Ga_yO_{19}:xCr^{3+}$, where x satisfies 0.1≤x≤0.3 and y satisfies 1 or more, and wherein an emission spectrum of the third light alone has a ratio of an intensity of 690 nm relative to an intensity of 780 nm of 0.3 or less.

2. The light emitting device of claim 1, wherein the emission spectrum of the third light alone has a full-width-half-maximum (FWHM) of 90 nm to 110 nm.

3. The light emitting device of claim 1, wherein the emission spectrum of the third light alone has a first peak at 670 nm to 700 nm and a second peak at 740 nm to 820 nm, and a ratio of an intensity of the first peak relative to an intensity of the second peak is 0.2 or less.

4. The light emitting device of claim 1, wherein final light of the light emitting device has an emission spectrum in which a ratio of an area of 550 nm or less relative to an area of 550 nm or more is 2% or less.

5. The light emitting device of claim 1, wherein an emission spectrum of final light covers 60% or more of an ATP action spectrum.

6. The light emitting device of claim 1, wherein final light is red light.

7. The light emitting device of claim 1, wherein an emission spectrum of final light of the light emitting device has a first peak at 630 nm to 680 nm and a second peak at 740 nm to 820 nm.

8. The light emitting device of claim 7, wherein a ratio of an intensity of the first peak relative to an intensity of the second peak is 0.4 to 0.8.

9. The light emitting device of claim 7, wherein the emission spectrum of the final light has a sub-peak between the first peak and a valley between the first peak and the second peak.

10. The light emitting device of claim 9, wherein the sub-peak is located between 670 nm and 700 nm.

11. The light emitting device of claim 1, wherein the first light of the light emitting diode chip has a peak ranging 425 nm to 465 nm.

12. The light emitting device of claim 1, wherein the second light has a peak ranging 630 nm to 650 nm.

13. The light emitting device of claim 1, wherein the wavelength conversion material comprises at least one of a phosphor or a quantum dot.

14. The light emitting device of claim 13, wherein the wavelength conversion material comprises at least one phosphor selected from the group consisting of $(Sr,Ca)AlSiN_3:Eu^{2+}$, $CaAlSiN_3:Eu^{2+}$, and $K_xSiF_y:Mn^{4+}$ (2≤x≤3, 4≤y≤7).

15. A light emitting device comprising:

a light emitting diode chip configured to emit light having a peak wavelength of 400 nm to 470 nm;

a red wavelength conversion material converting a portion of the light into red light having a peak wavelength of 620 nm to 670 nm; and a near-infrared phosphor configured to convert a portion of the light into near-infrared light having a peak wavelength of 740 nm to 820 nm, wherein the near-infrared phosphor comprises a phosphor represented by composition formula $CaAl_{(12-x-y)}Ga_yO_{19}:xCr^{3+}$, where x satisfies 0.1≤x≤0.3 and y satisfies 1 or more, and an emission spectrum of the near-infrared light has a ratio of an intensity of 690 nm relative to an intensity of 780 nm of 0.3 or less, and has a full-width-half-maximum (FWHM) of 90 nm to 110 nm, wherein an emission spectrum of final light of the light emitting device covers 60% or more of an ATP action spectrum.

16. The light emitting device of claim 15, wherein in the emission spectrum of the final light a ratio of an area of 550 nm or less relative to an area of 550 nm or more is 2% or less.

17. The light emitting device of claim 15, wherein the emission spectrum of the final light covers 75% or more of an ATP action spectrum.

18. The light emitting device of claim 15, wherein the emission spectrum of the final light has a first peak at 630 nm to 680 nm and a second peak at 740 nm to 820 nm, and wherein a ratio of an intensity of the first peak relative to an intensity of the second peak is 0.4 to 0.8.

19. The light emitting device of claim 15, wherein the red wavelength conversion material comprises at least one phosphor selected from the group of consisting of $(Sr,Ca)AlSiN_3:Eu^{2+}$, $CaAlSiN_3:Eu^{2+}$, and $K_xSiF_y:Mn^{4+}$ ($2 \leq x \leq 3$, $4 \leq y \leq 7$).

20. A near-infrared phosphor represented by composition formula $CaAl_{(12-x-y)}Ga_yO_{19}:xCr^{3+}$, where x satisfies $0.1 \leq x \leq 0.3$ and y satisfies 1 or more, wherein an emission spectrum by excitation light of the near-infrared phosphor has a ratio of an intensity of 690 nm relative to an intensity of 780 nm of 0.3 or less, and has a full-width-half-maximum (FWHM) of 90 nm to 110 nm.

* * * * *